US011296614B2

(12) United States Patent
Kim

(10) Patent No.: US 11,296,614 B2
(45) Date of Patent: Apr. 5, 2022

(54) POWER CONVERSION DEVICE FOR VEHICLE

(71) Applicants: Hyundai Motor Company, Seoul (KR); Kia Motors Corporation, Seoul (KR)

(72) Inventor: Yun Ho Kim, Seoul (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 66 days.

(21) Appl. No.: 17/027,016

(22) Filed: Sep. 21, 2020

(65) Prior Publication Data

US 2021/0281187 A1 Sep. 9, 2021

(30) Foreign Application Priority Data

Mar. 3, 2020 (KR) .................. 10-2020-0026852

(51) Int. Cl.
*H02M 7/00* (2006.01)
*B60R 16/033* (2006.01)
*H05K 1/18* (2006.01)
*H05K 7/20* (2006.01)

(52) U.S. Cl.
CPC ........... *H02M 7/003* (2013.01); *B60R 16/033* (2013.01); *H05K 1/181* (2013.01); *H05K 7/20845* (2013.01); *H05K 2201/10151* (2013.01)

(58) Field of Classification Search
CPC ..... H02M 7/003; B60R 16/003; H05K 1/181; H05K 7/20845; H05K 2201/10151; G01R 15/202
See application file for complete search history.

(56) References Cited

U.S. PATENT DOCUMENTS

| 2010/0097765 | A1* | 4/2010 | Suzuki | B60K 6/405 |
| | | | | 361/699 |
| 2013/0279114 | A1* | 10/2013 | Nishikimi | B60L 3/003 |
| | | | | 361/699 |
| 2016/0204597 | A1* | 7/2016 | Hotta | H02H 7/08 |
| | | | | 318/139 |
| 2016/0332524 | A1* | 11/2016 | Yoon | F01P 1/06 |

FOREIGN PATENT DOCUMENTS

KR     10-2013-0065390 A     6/2013

* cited by examiner

*Primary Examiner* — Sherman Ng
(74) *Attorney, Agent, or Firm* — Morgan, Lewis & Bockius LLP

(57) ABSTRACT

A power conversion device for a vehicle, may include a power conversion module assembly having a capacitor configured to receive a direct current (DC) current from a battery of the vehicle, a power conversion module configured to convert the DC current supplied from the capacitor, into an alternating current (AC) current, and a control unit connected to the power conversion module and configured to control the power conversion module; a housing assembled with the power conversion module assembly; and an output terminal assembly including a plurality of output terminals through which the AC currents converted through the power conversion module assembly are output, a core, and a Hall integrated circuit (IC) configured to detect a variation in magnetic flux of the core when the AC currents flow in the output terminals and measure the AC currents of the output terminals.

11 Claims, 4 Drawing Sheets

300(310,320,330,340,350,360,370)

POWER CONVERSION DEVICE FOR VEHICLE

CROSS REFERENCE TO RELATED APPLICATION

The present application claims priority to Korean Patent Application No. 10-2020-0026852 filed on Mar. 3, 2020, the entire contents of which is incorporated herein for all purposes by this reference.

BACKGROUND OF THE INVENTION

Field of the Invention

The present invention relates to a power conversion device for a vehicle, and more particularly, to a power conversion device for a vehicle, in which an output terminal and a current sensor are integrated.

Description of Related Art

A power conversion device of an eco-friendly vehicle receives a direct current (DC) current from a high-voltage battery, converts the DC current into an alternating current (AC) current, supplies the AC current to a motor, and adjusts a magnitude and a phase of the AC current, controlling a torque and a rotation speed of the motor.

An inside of the power conversion device may be broadly divided into a power portion for converting a DC current into an AC current, and a control portion for controlling a magnitude and a phase of the current. The power portion includes a bus bar through which a current flows, and a switch element and a power module by which the current is converted, and the control portion includes a gate board, a control board, and lines for transmitting and receiving a signal to or from sensors.

Meanwhile, a current sensor of the conventional power conversion device mainly employs a Hall type current sensor. The Hall type current sensor includes a core through which a current passes and a Hall integrated circuit (IC) for detecting a variation in magnetic flux of the core. In the Hall type current sensor, since a current may pass through the core, the Hall type current sensor is coupled to a three-phase output bus bar.

Owing to a function of the Hall type current sensor, the Hall type current sensor may be coupled to the three-phase output bus bar. However, since a process of manufacturing the three-phase output bus bar is different from a process of manufacturing the Hall type current sensor, it is difficult to integrate the three-phase output bus bar with the Hall type current sensor. The three-phase output bus bar is manufactured by performing plastic molding at once through insert injection, whereas the Hall type current sensor is manufactured by assembling a core, a Hall IC, and a control printed circuit board (PCB) in a plastic housing. Owing to the above process problem, the Hall type current sensor is manufactured as an individual portion and assembled with the three-phase output bus bar, being mainly delivered as a sub-assembly. However, in such a sub-assembly type, since individual parts are manufactured and assembly man-hours are added, there is a problem in that a manufacturing cost increases.

Furthermore, since the Hall type current sensor may be assembled in a section in which a current flows in a straight line, there is a limitation in that it is not possible to efficiently utilize an internal space of the power conversion device.

The information included in this Background of the present invention section is only for enhancement of understanding of the general background of the present invention and may not be taken as an acknowledgement or any form of suggestion that this information forms the prior art already known to a person skilled in the art.

BRIEF SUMMARY

Various aspects of the present invention are directed to providing a power conversion device configured for a vehicle, which is configured for entirely reducing a production cost and reducing a volume of the power conversion device by integrating a current sensor with an output terminal of the power conversion device.

According to one aspect, there is provided a power conversion device configured for a vehicle, which includes a power conversion module assembly having a capacitor configured to receive a direct current (DC) current from a battery of the vehicle, a power conversion module configured to convert the DC current supplied from the capacitor into an alternating current (AC) current, and a control unit connected to the power conversion module and configured to control the power conversion module; a housing assembled with the power conversion module assembly; and an output terminal assembly including a plurality of output terminals through which the AC currents converted through the power conversion module assembly are output, a core, and a Hall integrated circuit (IC) configured to detect a variation in magnetic flux of the core when the AC currents flow in the output terminals and measure the AC currents of the output terminals.

The output terminal assembly may further include an output terminal housing which has a block shape in which an accommodation space is formed and has one open surface, which includes three hollow cylindrical portions, and in which the output terminals are assembled inside the three hollow cylindrical portions.

The core may be assembled at an external side of each of the three hollow cylindrical portions of the output terminal housing, and a slit may be formed in a portion of a circumference of the core.

The Hall IC may be assembled with the slit formed in the core, may detect a variation in magnetic flux of the core when the AC current flows into the output terminal, and may measure the AC current flowing into the output terminal on the basis of the detected variation in magnetic flux.

The power conversion device may further include one or more among a printed circuit board (PCB) located above the core, connected to the Hall IC, and configured to receive AC current information on the output terminal, which is measured through the Hall IC, and transmit the AC current information on the output terminal; and a cover located above the PCB and configured to cover a surface of an opening of the output terminal housing.

The core, the Hall IC, and the PCB may be accommodated in the internal accommodation space of the output terminal housing.

The core may be assembled at each of external sides of the two or more cylindrical portions, and the Hall IC may be assembled with a slit formed in the core assembled at each of the external sides of the two or more cylindrical portions.

The power conversion module assembly may further include a cooler configured to cool the power conversion module.

The power conversion device may further include a three-phase output bus bar located between the power conversion module and the output terminal and configured to transmit a three-phase AC current, which is output from the power conversion module, to the output terminal.

The output terminal housing may be made of a plastic material, the output terminal may be made of a metal material, and the output terminal may be insert-injected and fixed in the cylindrical portion of the output terminal housing.

The output terminal housing may be made of a plastic material, the output terminal may be made of a metal material, and the output terminal may be press-inserted into and fixed in the cylindrical portion of the output terminal housing.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
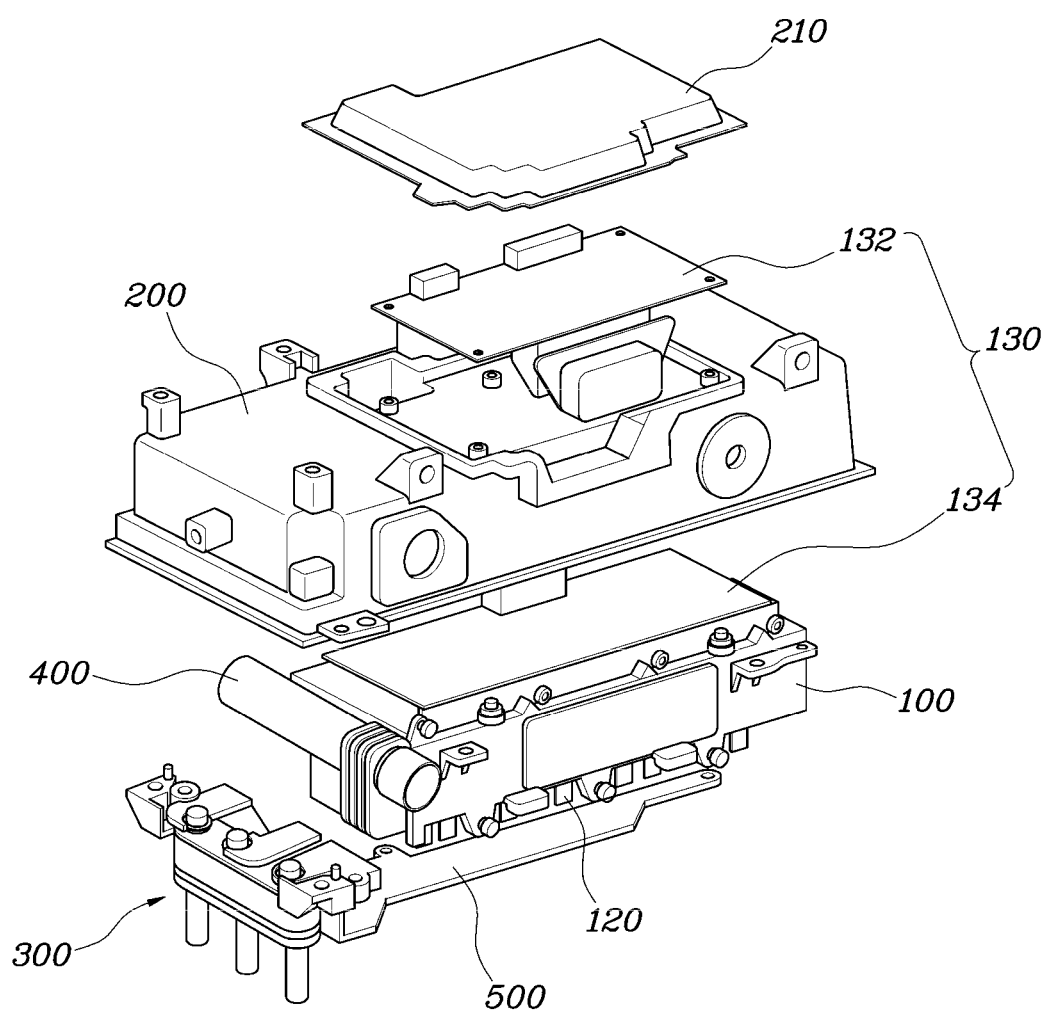
FIG. 1 is an exploded perspective view exemplarily illustrating a power conversion device configured for a vehicle according to various exemplary embodiments of the present invention.

It may be understood that the appended drawings are not necessarily to scale, presenting a somewhat simplified representation of various features illustrative of the basic principles of the present invention. The specific design features of the present invention as included herein, including, for example, specific dimensions, orientations, locations, and shapes will be determined in part by the particularly intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the present invention(s) will be described in conjunction with exemplary embodiments of the present invention, it will be understood that the present description is not intended to limit the present invention(s) to those exemplary embodiments. On the other hand, the present invention(s) is/are intended to cover not only the exemplary embodiments of the present invention, but also various alternatives, modifications, equivalents and other embodiments, which may be included within the spirit and scope of the present invention as defined by the appended claims.

Specific structural and functional descriptions of the exemplary embodiments of the present invention included in the present disclosure or application are illustrative only for describing the embodiments, and the exemplary embodiments according to various exemplary embodiments of the present invention may be implemented in various forms and may not be construed as being limited to the exemplary embodiments described in the present disclosure or application.

The exemplary embodiments according to various exemplary embodiments of the present invention may be variously modified and may have various forms, so that specific embodiments will be illustrated in the drawings and be described in detail in the present disclosure or application. It may be understood, however, that it is not intended to limit the exemplary embodiments according to the concept of the present invention to specific disclosure forms, but it includes all modifications, equivalents, and alternatives falling within the spirit and scope of the present invention.

The terms first, second, or the like may be used to describe various components, but the components may not be limited by these terms. These terms may be used only for distinguishing one component from another component, and for example, a first component may be referred to as a second component, and similarly, the second component may also be referred to as the first component without departing from the scope of the present invention.

When a component is referred to as being "connected," or "coupled" to another component, the component may be directly connected or coupled to the another component, but it may be understood that yet another component may be present between the component and another component. Contrarily, when a component is referred to as being "directly connected," or "directly coupled" to another, it may be understood that yet another component may not be present between the component and another component. Other expressions describing the relationship between components, that is, "between" and "immediately between," or "adjacent to" and "directly adjacent to" may also be construed as described above.

Terms used herein are used only for describing specific embodiments and are not intended to limit the present invention. Unless the context clearly dictates otherwise, the singular form includes the plural form. In the present disclosure, it may be understood that the terms "including," "having," or the like are used to specify that a feature, a number, a step, an operation, a component, an element, or a combination thereof described herein exists, and they do not preclude the presence or addition of one or more other features, numbers, steps, operations, components, elements, or combinations thereof.

Unless defined otherwise, all terms including technical or scientific terms used herein have the same meaning as commonly understood by those skilled in the art to which various exemplary embodiments of the present invention pertains. General terms that are defined in a dictionary may be construed to have meanings that are consistent in the context of the relevant art and will not be interpreted as having an idealistic or excessively formalistic meaning unless clearly defined in the present disclosure.

Hereinafter, various exemplary embodiments of the present invention will be described in detail with reference to the accompanying drawings. Like reference numerals denote like members throughout the drawings.

Figure 2:
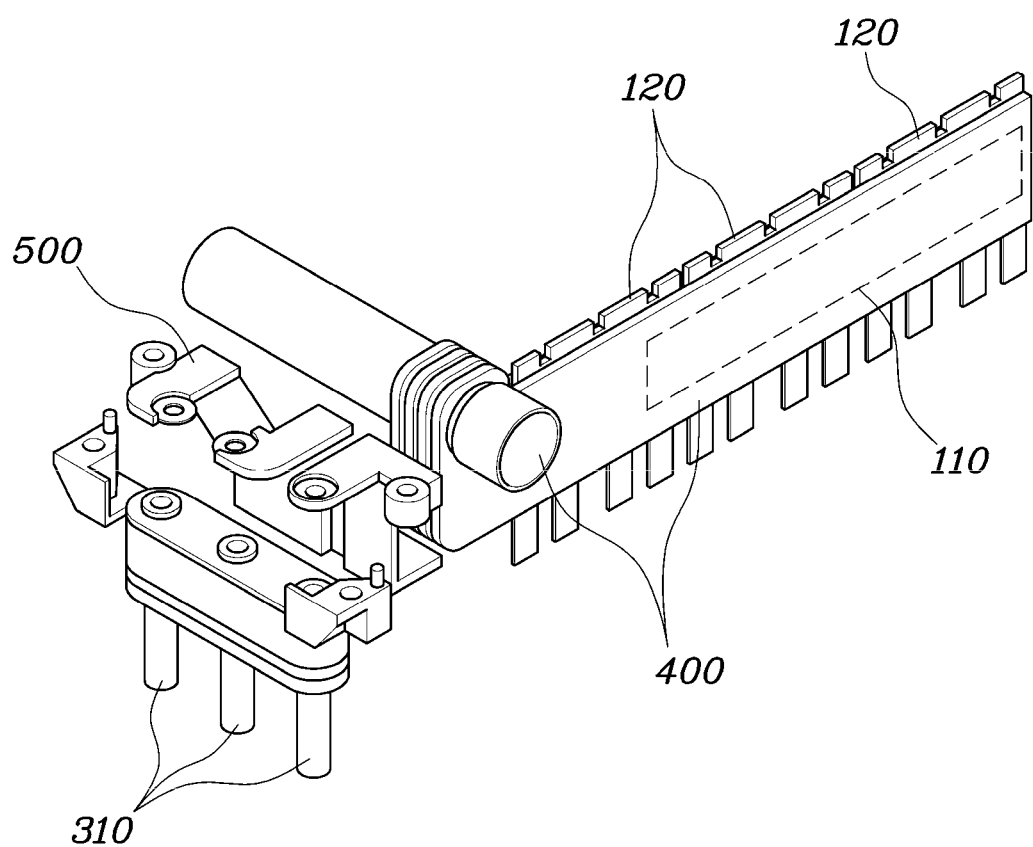
FIG. 2 is an exploded perspective view exemplarily illustrating portions related to a current flow in the power conversion device configured for a vehicle according to various exemplary embodiments of the present invention.
Figure 3:
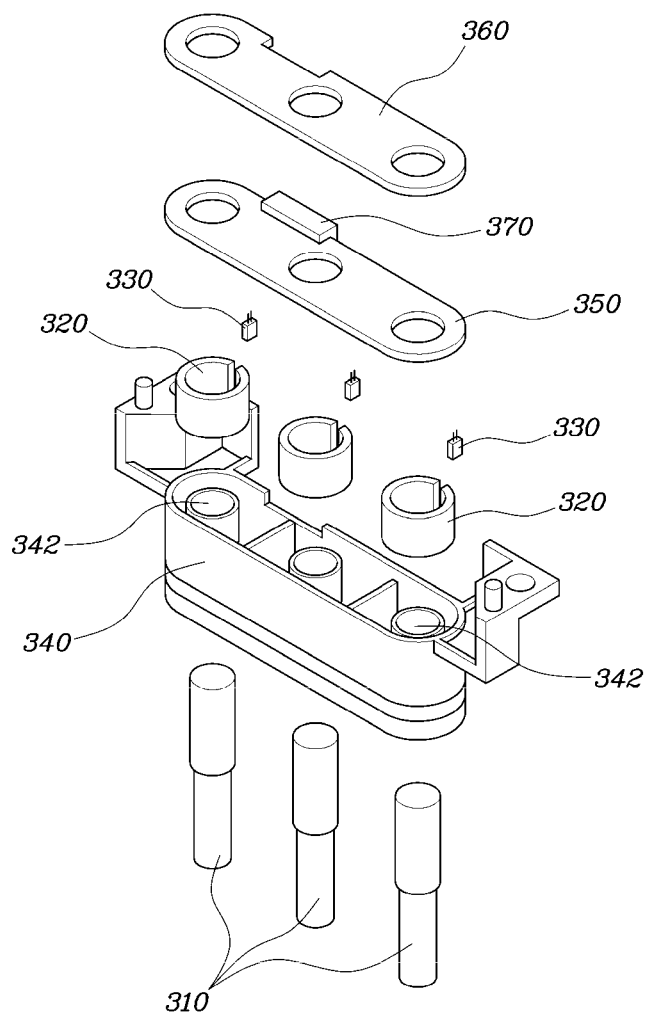
FIG. 3 is an exploded perspective view exemplarily illustrating an output terminal assembly of the power conversion device configured for a vehicle according to various exemplary embodiments of the present invention.
Figure 4:
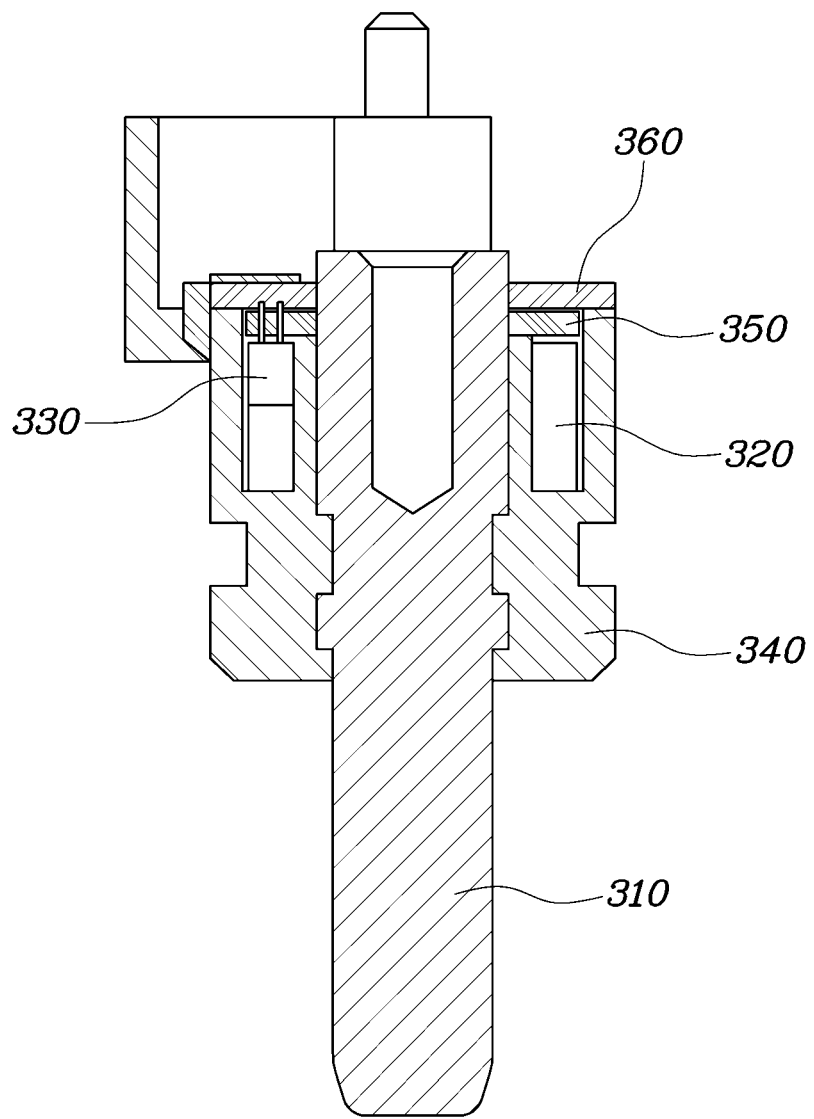
FIG. 4 is a cross-sectional view exemplarily illustrating a state in which the output terminal assembly of the power conversion device configured for a vehicle is assembled according to various exemplary embodiments of the present invention.

FIG. 1 is an exploded perspective view exemplarily illustrating a power conversion device configured for a vehicle according to various exemplary embodiments of the present invention, FIG. 2 is an exploded perspective view exemplarily illustrating portions related to a current flow in the power conversion device configured for a vehicle according to various exemplary embodiments of the present invention, FIG. 3 is an exploded perspective view exemplarily illustrating an output terminal assembly of the power conversion device configured for a vehicle according to various exemplary embodiments of the present invention, and FIG. 4 is a cross-sectional view exemplarily illustrating a state in which the output terminal assembly of the power conversion device configured for a vehicle is assembled according to various exemplary embodiments of the present invention.

Referring to FIG. 1, FIG. 2, FIG. 3, and FIG. 4, a power conversion device configured for a vehicle according to various exemplary embodiments of the present invention may include a power conversion module assembly 100, a housing 200, and an output terminal assembly 300.

The power conversion module assembly 100 may include a capacitor 110 which receives a direct current (DC) current from a battery of the vehicle, a power conversion module 120 for converting the DC current supplied from the capacitor 110 into an alternating current (AC) current, and a control unit 130 for controlling the power conversion module 120.

Although not shown in detail in the drawings, the capacitor 110 may include a current supply terminal for supplying a DC current to the power conversion module 120, and a three-phase output bus bar 500 for transmitting a current, which is output from the power conversion module 120, to a driving portion. Here, the driving portion may be a motor according to an exemplary embodiment of the present invention. Although not shown in the drawings, an output terminal 310 of the power conversion device may be connected to the driving portion, and the three-phase output bus bar 500 may be connected to the output terminal 310. Thus, the DC current is supplied from the capacitor 110 to the power conversion module 120, and the AC current converted in the power conversion module 120 is supplied to the motor through the three-phase output bus bar 500 and the output terminal 310 so that the motor may be driven. Here, the three-phase output bus bar 500 is located between the power conversion module 120 and the output terminal 310 and is configured to transmit a three-phase AC current, which is output from the power conversion module 120, to the output terminal 310.

The power conversion module 120 includes a plurality of switching elements and is configured to convert the DC current, which is supplied from the capacitor 110, into the AC current. The power conversion device according to various exemplary embodiments of the present invention may include one or more power conversion modules 120. According to various exemplary embodiments of the present invention, the power conversion module 120 may be an insulated gate bipolar transistor (IGBT). However, this is merely an exemplary embodiment and various semiconductor devices may be used as the power conversion module in various exemplary embodiments of the present invention.

Although not shown in detail in the drawings, the power conversion module 120 may include a power terminal through which a current is input and output, and a signal terminal through which a signal is input and output.

Here, the power terminal may include an input terminal electrically connected to the current supply terminal provided in the capacitor 110 and configured to receive the DC current from the capacitor 110, and an output terminal configured to output the AC current which is converted from the DC current through the plurality of switching elements in the power conversion module 120. In the instant case, the output terminal may be electrically connected to the above-described three-phase output bus bar 500.

Furthermore, the signal terminal may be connected to the control unit 130, and a control signal may be received from the control unit 130 through the signal terminal.

The control unit 130 is configured to control the power conversion module 120. According to various exemplary embodiments of the present invention, the control unit 130 may include a control board 132 and a gate board 134. Here, the control board 132 and the gate board 134 may be connected through a wire. As shown in FIG. 1, the control board 132 may be located above the gate board 134 in parallel. Furthermore, the gate board 134 may be connected to the signal terminal of the power conversion module 120.

The power conversion module assembly 100 may be assembled with the housing 200. Furthermore, referring to FIG. 1, the control board 132 accommodated in an internal accommodation space of the housing 200 may be sealed through a housing cover 210.

The output terminal assembly 300 may include the output terminal 310 through which the AC current converted through the power conversion module assembly 100 is output, a core 320, and a Hall IC 330 and may further include one or more among an output terminal housing 340, a printed circuit board (PCB) 350, and a cover 360.

The output terminal 310 is configured to output the AC current converted through the power conversion module assembly 100. According to various exemplary embodiments of the present invention, as shown in FIG. 3, since the output terminal 310 may supply a three-phase AC current to the motor, the output terminal 310 may be provided as three output terminals 310 and made of a metal material. A bolt tap is provided in the output terminal 310 made of a metal material, and thus the output terminal 310 may be connected to the three-phase output bus bar 500.

Referring to FIG. 3 and FIG. 4, the core 320 may be assembled with an external side of a cylindrical portion 342 of the output terminal housing 340, which will be described below, and a slit may be formed in a portion of a circumference of the core 320.

Referring to FIG. 3 and FIG. 4, the Hall IC 330 may be assembled with the slit formed in the core 320. Furthermore, when the AC current flows into the output terminal 310, the Hall IC 330 may detect a variation in magnetic flux of the core 320 and measure the AC current flowing into the output terminal 310 on the basis of the detected variation in magnetic flux. Since a technique in which the Hall IC 330 detects the variation in magnetic flux of the core 320 and measures the AC current flowing into the output terminal 310 on the basis of the detected variation in magnetic flux is a well-known technique, a detailed description thereof will be omitted herein.

As shown in FIG. 3, the output terminal housing 340 may have a block shape in which an accommodation space is formed and have a shape of which one surface is open. Furthermore, the output terminal housing 340 may include three hollow cylindrical portions 342, and as shown in FIG. 4, the output terminal 310 may be assembled in each of the cylindrical portions 342.

According to various exemplary embodiments of the present invention, the output terminal housing 340 is made of a plastic material, and the output terminal 310 is made of a metal material so that the output terminal 310 may be insert-injected into and fixed in the cylindrical portion 342 of the output terminal housing 340.

Alternatively, the output terminal housing 340 is made of a plastic material, and the output terminal 310 is made of a metal material so that the output terminal 310 may be press-inserted into and fixed in the cylindrical portion 342 of the output terminal housing 340.

The PCB 350 is located above the core 320, connected to the Hall IC 330 to receive AC current information on the output terminal 310, which is measured through the Hall IC 330, and transmits the AC current information on the output terminal 310, which is transmitted through a connector 370, to a main controller of the power conversion device.

The cover 360 is located above the PCB 350 and is configured to cover a surface of an opening of the output terminal housing 340.

Meanwhile, an output terminal housing of the conventional power conversion device has a structure in which an O-ring is assembled to maintain airtightness with respect to the outside. To the present end, an O-ring mounting groove and an external shape for maintaining an O-ring shape are required in the output terminal housing, and an internal space of the output terminal housing, which has an accommodation space, has no other function except for a function of fixing the output terminal.

As described above, in accordance with the power conversion device configured for a vehicle according to various exemplary embodiments of the present invention, the internal space of the output terminal housing, which is not used in the conventional power conversion device, is utilized, and thus the core, the Hall IC, and the PCB, which serve as the current sensor, are accommodated in an internal accommodation space of the output terminal housing 340. Consequently, without an increase in volume, the current sensor is integrated into the output terminal assembly so that an entire size of the power conversion device may be reduced.

Furthermore, in accordance with the power conversion device configured for a vehicle according to various exemplary embodiments of the present invention, the core, the Hall IC, and the PCB of the current sensor are directly used, but a case of the current sensor and processes of manufacturing and assembling the current sensor are omitted, and thus a production cost may be reduced.

Meanwhile, the cores 320 may be assembled at external sides of two or more among the three cylindrical portions 342 formed in the output terminal housing 340, and the Hall IC 330 may be assembled with the slit formed in each of the cores 320 which are assembled at the external sides of the cylindrical portions 342.

A method of detecting an output current of the power conversion device may be classified into a three-phase detecting method of detecting all three phases of U, V, and W, and a two-phase detecting method of detecting two phases and estimating the remaining one phase through correction.

According to various exemplary embodiments of the present invention, as shown in FIG. 3, in various exemplary embodiments of the present invention, the cores 320 are assembled with all the three cylindrical portions 342 formed in the output terminal housing 340, and the Hall IC 330 is assembled with the slit formed in each of the cores 320 assembled at the external sides of the three cylindrical portions 342 so that a three-phase detecting method may be implemented.

Alternatively, in various exemplary embodiments of the present invention, the cores 320 are assembled at the external sides of two among the three cylindrical portions 342 formed in the output terminal housing 340, and the Hall IC 330 is assembled with the slit formed in each of the cores 320 assembled at the external sides of the two cylindrical portions 342 so that a two-phase detecting method may be implemented.

Meanwhile, the power conversion module assembly 100 may further include a cooler 400 for cooling the power conversion module 120. According to various exemplary embodiments of the present invention, the coolers 400 may be provided at two side of the power conversion module 120, and alternatively, the cooler 400 may be provided at only one side of the power conversion module 120.

In accordance with a power conversion device configured for a vehicle according to various exemplary embodiments of the present invention, an internal space of an output terminal housing, which is not used in the conventional power conversion device, is utilized, and thus a core, a Hall IC, and a PCB, which serve as a current sensor, may be accommodated in an internal accommodation space of the output terminal housing. Consequently, without an increase in volume, the current sensor is integrated into an output terminal assembly so that an entire size of the power conversion device may be reduced.

Furthermore, in accordance with the power conversion device configured for a vehicle according to various exemplary embodiments of the present invention, the core, the Hall IC, and the PCB of the current sensor are directly used, but a case of the current sensor and processes of manufacturing and assembling the current sensor are omitted, and thus a production cost may be reduced.

For convenience in explanation and accurate definition in the appended claims, the terms "upper", "lower", "inner", "outer", "up", "down", "upwards", "downwards", "front", "rear", "back", "inside", "outside", "inwardly", "outwardly", "internal", "external", "inner", "outer", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. A power conversion device for a vehicle, the device comprising:
   a power conversion module assembly including a capacitor configured to receive a direct current (DC) current from a battery of the vehicle, a power conversion module configured to convert the DC current supplied from the capacitor into an alternating current (AC) current, and a control unit connected to the power conversion module and configured to control the power conversion module;
   a housing assembled with the power conversion module assembly; and
   an output terminal assembly including a plurality of output terminals through which the AC current converted through the power conversion module assembly is output, a core, and a Hall integrated circuit (IC) configured to detect a variation in magnetic flux of the core when the AC current flows into the plurality of output terminals and measure the AC current of the plurality of output terminals.

2. The power conversion device of claim 1, wherein the output terminal assembly further includes an output terminal housing which has a block shape in which an accommodation space is formed and has one open surface, which includes three hollow cylindrical portions, and in which the plurality of output terminals is assembled inside the three hollow cylindrical portions.

3. The power conversion device of claim 2, wherein the core is assembled at an external side of each of the three hollow cylindrical portions of the output terminal housing, and a slit is formed in a portion of a circumference of the core.

4. The power conversion device of claim 3, wherein the Hall IC is assembled with the slit formed in the core, detects the variation in the magnetic flux of the core when the AC current flows into the plurality of output terminals, and measures the AC current flowing into the plurality of output terminals on a basis of the detected variation in the magnetic flux.

5. The power conversion device of claim 2, further including at least one of a printed circuit board (PCB) and a cover,
    wherein the PCB is located above the core, connected to the Hall IC, and configured to receive AC current information related to the plurality of output terminals measured through the Hall IC and transmit the AC current information related to the plurality of output terminals; and
    wherein the cover is located above the PCB and configured to cover a surface of an opening of the output terminal housing.

6. The power conversion device of claim 5, wherein the core, the Hall IC, and the PCB are accommodated in the internal accommodation space of the output terminal housing.

7. The power conversion device of claim 2, wherein the core is assembled at each of external sides of at least two cylindrical portions among the three hollow cylindrical portions, and the Hall IC is assembled with a slit formed in the core assembled at each of the external sides of the at least two cylindrical portions.

8. The power conversion device of claim 1, wherein the power conversion module assembly further includes a cooler configured to cool the power conversion module.

9. The power conversion device of claim 1, further including:
    a three-phase output bus bar located between the power conversion module and the plurality of output terminals and configured to transmit a three-phase AC current, which is output from the power conversion module, to the plurality of output terminals.

10. The power conversion device of claim 2, wherein the output terminal housing is made of a plastic material, the plurality of output terminals is made of a metal material, and the plurality of output terminals is insert-injected into and fixed in a cylindrical portion of the output terminal housing.

11. The power conversion device of claim 2, wherein the output terminal housing is made of a plastic material, the plurality of output terminals is made of a metal material, and the plurality of output terminals is press-inserted into and fixed in a cylindrical portion of the output terminal housing.

* * * * *